United States Patent [19]
Watts

[11] Patent Number: 5,166,645
[45] Date of Patent: Nov. 24, 1992

[54] DIFFERENTIAL MIXER OSCILLATOR

[75] Inventor: Milton H. Watts, Salt Lake City, Utah

[73] Assignee: Quartzdyne, Inc., Salt Lake City, Utah

[21] Appl. No.: 821,026

[22] Filed: Jan. 15, 1992

[51] Int. Cl.$^5$ .................. H03B 5/36; H03B 21/01
[52] U.S. Cl. .................. 331/37; 331/38; 331/46; 331/116 R; 331/158; 455/333
[58] Field of Search .................. 331/37, 38, 39, 42, 331/43, 46, 53, 77, 116 R, 116 FE, 117 R, 117 FE, 158; 455/255, 333

[56] References Cited

U.S. PATENT DOCUMENTS

| | | | |
|---|---|---|---|
| 3,378,790 | 4/1968 | Bray | 331/116 R |
| 3,986,145 | 10/1976 | Hongu et al. | 331/116 R X |
| 4,052,682 | 10/1977 | Wilcox | 331/117 R X |
| 4,661,785 | 4/1987 | Benjaminson | 331/109 |
| 4,782,309 | 11/1988 | Benjaminson | 331/139 |
| 4,959,624 | 9/1990 | Higgins, Jr. et al. | 331/116 R |

FOREIGN PATENT DOCUMENTS

| | | | |
|---|---|---|---|
| 0039811 | 4/1978 | Japan | 455/333 |
| 1566461 | 5/1990 | U.S.S.R. | 455/333 |

OTHER PUBLICATIONS

Clark et al., *Communications Circuits: Analysis and Design*, Addison-Wesley (1971) pp. 252, 309.

Hewlett-Packard Company, Delcon Division, *Operating and Service Manual Quartz Pressure Gauge System 2811B* (excerpts), Mar. 1979.

*Primary Examiner*—Davis Mis
*Attorney, Agent, or Firm*—Trask, Britt & Rossa

[57] ABSTRACT

A differential mixer oscillator employing two transistors in a differential pair as the sustaining amplifier for a quartz crystal resonator at some first high frequency. The bias current of the differential pair is modulated at a second high frequency derived from some second frequency generating source, typically a second quartz crystal resonator, and the product terms are available at the collectors of the two transistors for selective filtering. The differential mixer oscillator may be employed in multiples, and with a variety of current sources, such as a Colpitts oscillator circuit.

14 Claims, 7 Drawing Sheets

$$I_k = I_{k0} + G_1 V_1 \cos \omega_0 t$$

$$G_1 = \frac{1}{R_E + r_{in}}$$

$$\approx \frac{1}{R_E}$$

DIFFERENTIAL MIXER OSCILLATOR

BACKGROUND OF THE INVENTION

Field of the Invention

The present invention relates generally to oscillators for use with quartz resonant sensing elements, and more specifically to a means for minimizing component count and power consumption for such oscillators when a mixed frequency output is desired.

State of the Art

Simple quartz crystal oscillators have been built for decades, and are widely used in science and industry. However, in applications wherein power availability and physical space are limited, such as in instrumentation employed in subterranean wellbores and in aerospace components, the additional requirements of buffering, mixing and then filtering the output are burdensome.

Balanced mixers based upon a differential transistor configuration are well known, and are used in communications equipment, as illustrated in Clark, et al, *COMMUNICATIONS CIRCUITS ANALYSIS AND DESIGN*, Addison-Wesley, (1971) p. 309, and reproduced in the drawings accompanying this application as FIG. 1. In the illustrated circuit, an RF signal is applied to the bases of a differential transistor pair through a transformer. A local oscillator signal is superimposed on the bias current Ik. The collector current of the two transistors contains product terms including sum and difference frequencies. The desired output is selected by the frequency dependent impedances at the collectors. U.S. Pat. No. 4,661,785 to Benjaminson discloses a balanced feedback oscillator employing a differential transistor configuration in a bridge oscillator employing a constant current source. Page 252 of the aforementioned Clark et al. text discloses a differential series oscillator.

Another prior art circuit, a variant of the standard Pierce oscillator, employs two transistors in a differential pair configuration and might be termed a differentially coupled Pierce oscillator. Such a circuit, illustrated by FIG. 2 of the drawings, provides for improved limiting characteristics and better load isolation than a standard Pierce oscillator. The circuit of FIG. 2 has been successfully employed in a quartz crystal resonator pressure transducer. However, the circuit of FIG. 2 does not provide a means for mixing two frequencies. The high frequency, high impedance output must first be buffered, mixed with a second frequency, and then filtered before the desired output is achieved. These functions require additional components and process.

Yet another prior art device illustrative of the state of the art is the Hewlett-Packard Model 2813B Quartz Pressure Probe. This device utilizes thickness-shear mode quartz pressure sensor and reference crystals, employs two active and one bias transistor per oscillator, and an additional five transistors per oscillator for voltage gain, buffering and limiting before the diode mixer stage is entered.

SUMMARY OF THE INVENTION

One aspect of the present invention, referred to herein as a differential mixer oscillator, or DMO, uses the two transistors in a differential pair as the sustaining amplifier for a quartz crystal resonator at some first high frequency. The bias current of the differential pair is modulated at a second high frequency derived from some second frequency generating source, typically a second quartz crystal resonator, and the product terms are available at the collectors of the two transistors for selective filtering.

The DMO of the present invention reduces necessary component count by using the same devices (components) to sustain resonance of the quartz crystal resonator and to mix its first, high frequency output with the second frequency to produce a lower frequency signal. The need to amplify and buffer the first, high frequency output prior to a mixing stage is eliminated, and buffering of the lower frequency difference signal requires significantly less power.

In summary, the use of the same transistor pair as both a sustaining amplifier and a mixer conserves space and power.

The DMO of the present invention may be employed in multiples, and with a variety of modulated current sources, such as a Colpitts oscillator circuit. Several alternative preferred embodiments employing multiple DMO's disclosed and claimed herein are specifically contemplated as being within the scope of the present invention.

BRIEF DESCRIPTION OF THE DRAWINGS

The present invention will be more fully understood by one of ordinary skill in the art through a review of the following detailed description of the preferred embodiments in conjunction with the accompanying drawings, wherein.

DETAILED DESCRIPTION OF THE PREFERRED EMBODIMENTS

Figure 1:
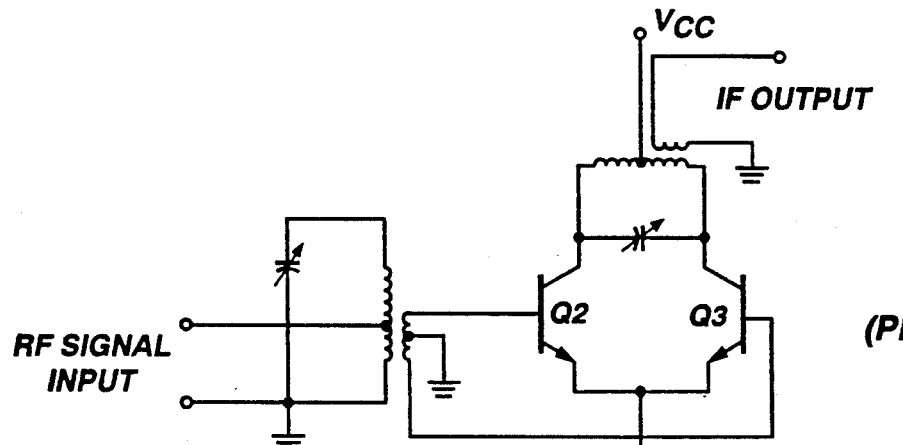
FIG. 1 is a circuit schematic of a prior art differential transistor balanced mixing circuit.
Figure 2:
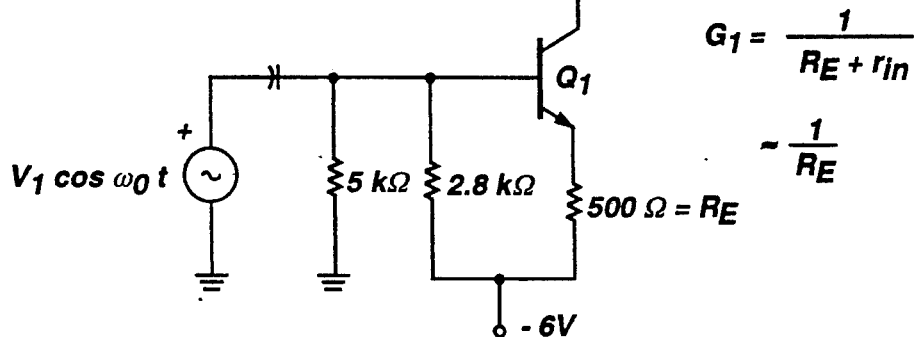
FIG. 2 is a circuit schematic of a prior art differentially coupled Pierce oscillator circuit.
Figure 2:
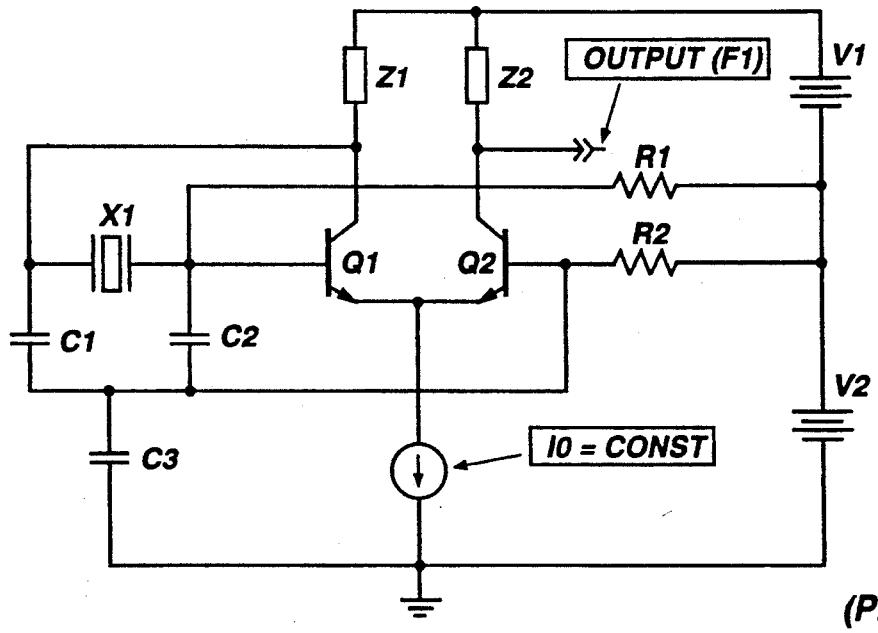
Figure 3:
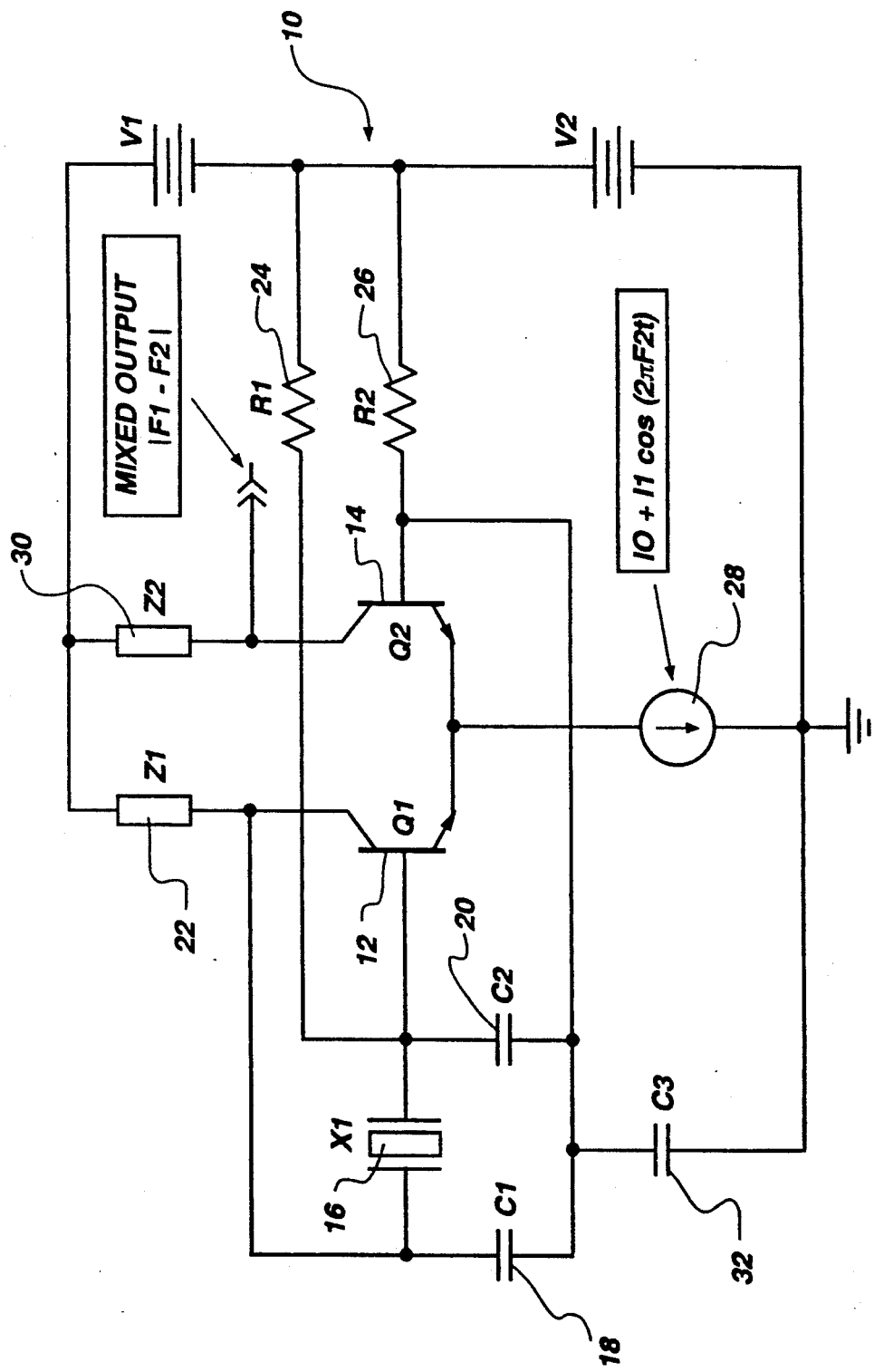
FIG. 3 is a circuit schematic of a differential mixer oscillator (DMO) according to the present invention.

FIG. 3 of the drawings illustrates a preferred embodiment 10 of a DMO according to the present invention. DMO 10 includes first and second transistors 12 and 14 in a differential pair configuration as a sustaining amplifier for quartz crystal resonator 16. Reactive components such as capacitors 18 and 20, and impedance 22, provide biasing and phase shift. Impedance 22 may be inductive, resistive, or active, and is significantly greater than the reactance 18 at the desired resonant frequency of resonator 16. Base bias for transistors 12 and 14 is provided by resistors 24 and 26, or may be provided by other means known in the art, such as RF chokes, DC connection to ground, etc. The constant DC component IO of the bias current from current source 28 is of sufficient magnitude to sustain oscillation of crystal resonator 16 at or near its resonant frequency F1. However, the bias current is also modulated at a second frequency F2, corresponding to $I1 \cos(2\pi F2 t)$.

The collector current of transistors 12 and 14 contains substantial frequency components at F1, F2, F1+F2 and |F1-F2|, as well as other harmonics. Impedance 30 is chosen to selectively filter the desired frequency output, and may comprise a tuned LC circuit or an RC low pass filter, depending upon the application for circuit 10. The node connecting reactances 18 and 20 may be grounded directly, or indirectly through a low impedance coupling capacitor 32. Additional coupling capacitors and bias resistors may be inserted in circuit 10 as appropriate, the choice thereof being well within the ability of one skilled in the art. The embodiment 10 of FIG. 3 has particular utility with a low impedance crystal 16, such as a crystal resonating in the thickness-shear mode.

Figure 4:
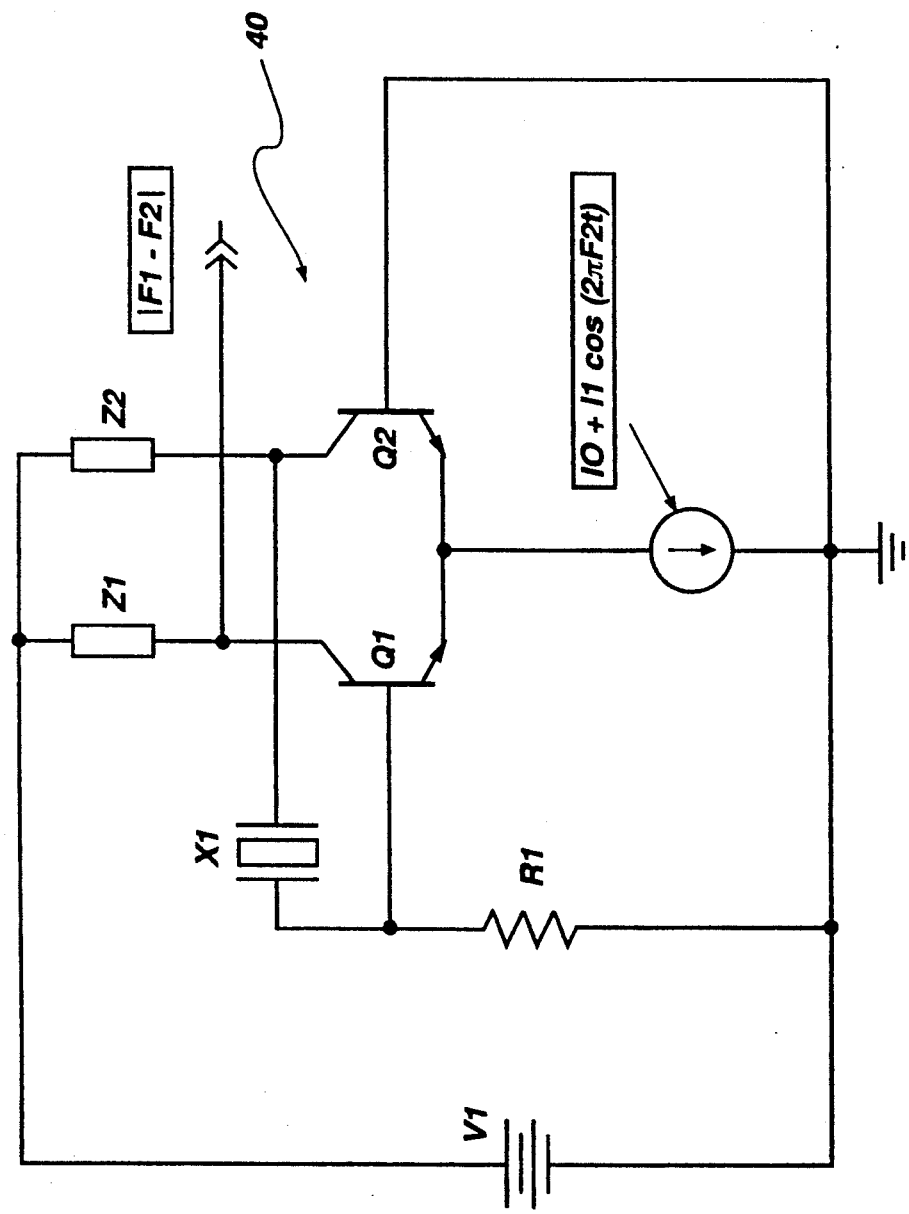
FIG. 4 is a circuit schematic of a differential series mixer oscillator according to the present invention.
Figure 5:
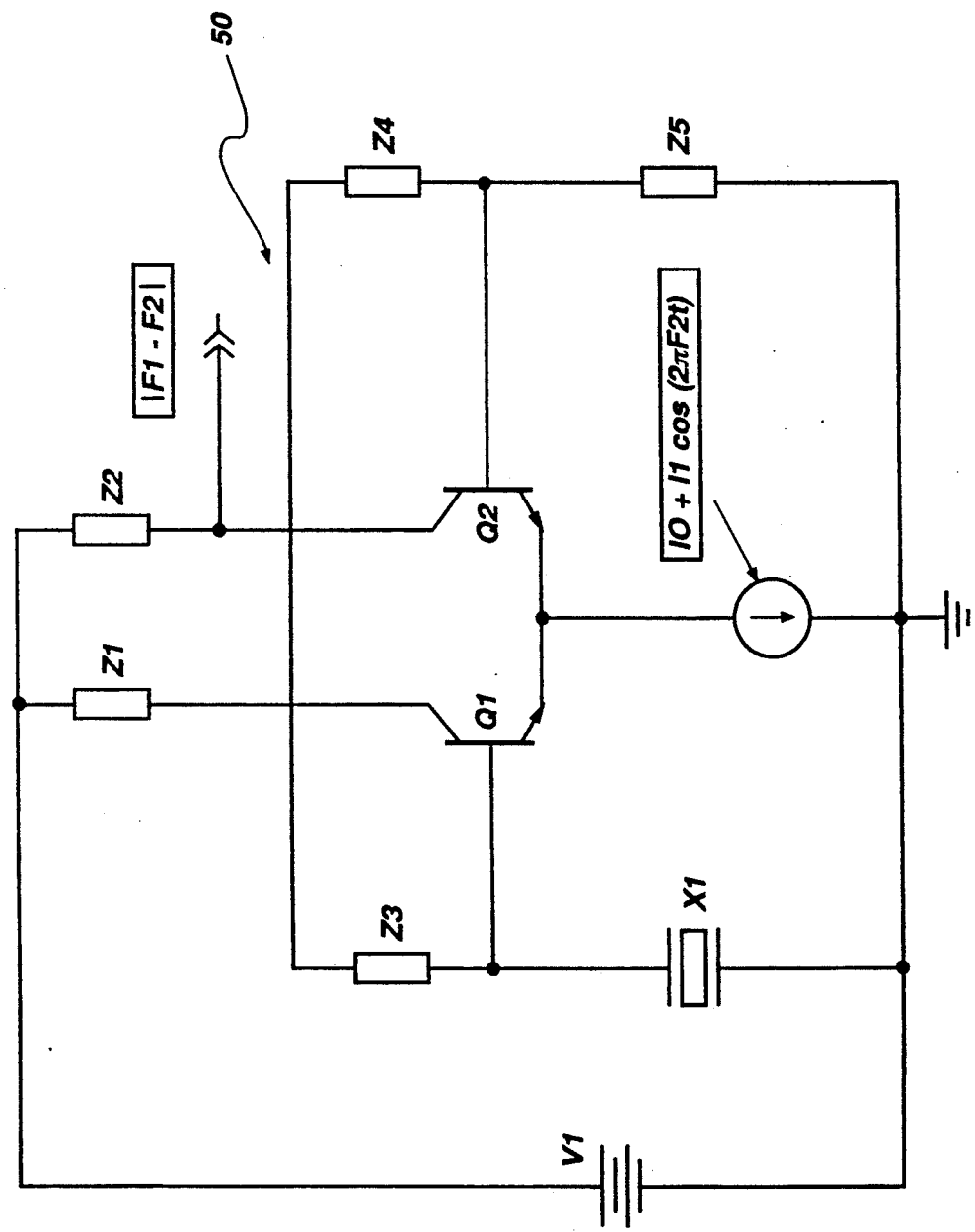
FIG. 5 is a circuit schematic of a differential bridge mixer oscillator according to the present invention.

Other differential mixer oscillator (DMO) configurations using a differential pair of transistors are contemplated, such as the differential series oscillator 40 illustrated by FIG. 4, and a balanced bridge DMO 50 illustrated by FIG. 5. The oscillator circuits of FIGS. 4 and 5 are contemplated to have particular applicability for use with high impedance crystal resonators, such as tuning fork resonators and dual mode resonators. Multiple stage differential amplifiers according to the present invention are also considered to be within its scope as a natural extension thereof.

Figure 6:
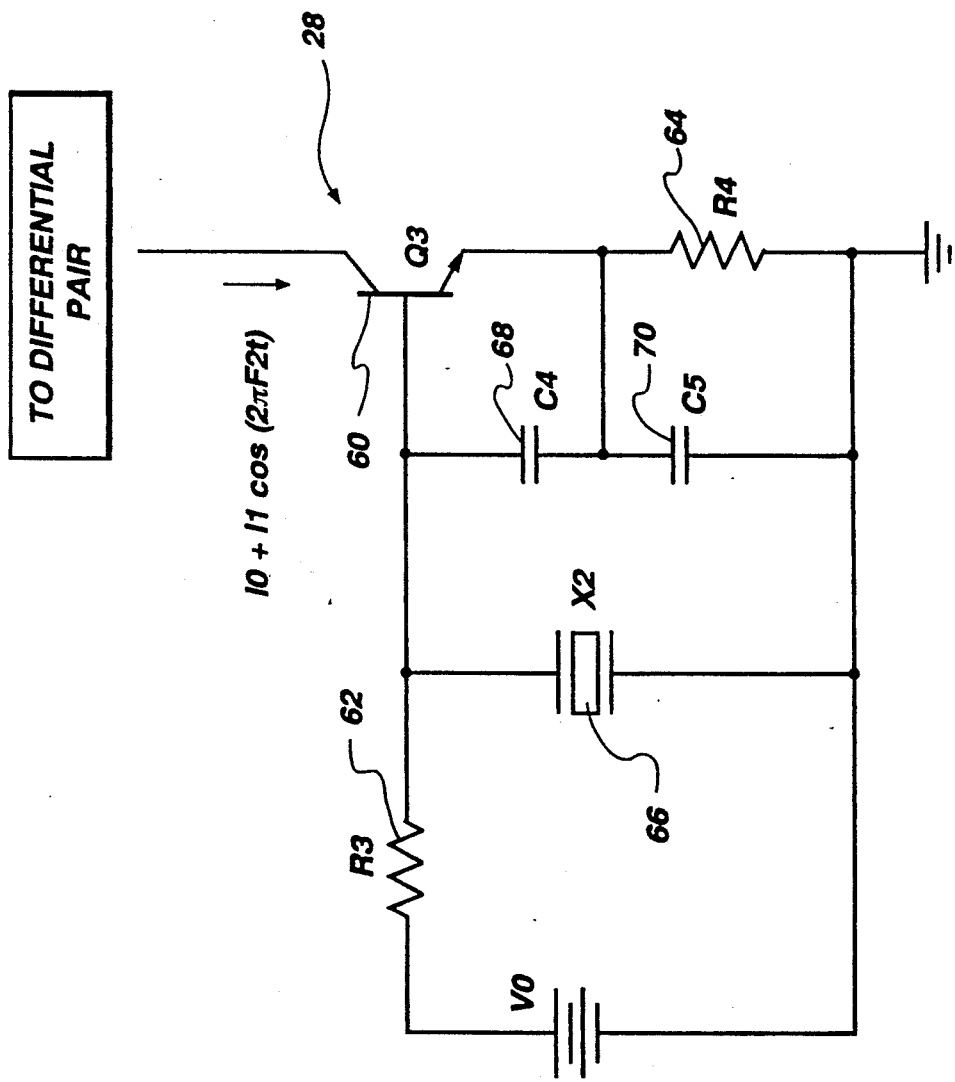
FIG. 6 is a schematic of a modulated current source with a Colpitts oscillator suitable for use with a DMO according to the present invention.

The current source for any of the foregoing DMO circuits may be modulated in one of several ways obvious to those skilled in the art, such as modulating the base voltage in a common emitter configuration, superpositioning of AC and DC currents in a current mirror, or superposition of an AC signal in a resistive current source. Current source 28 for the preferred embodiment 10 of FIG. 3 is illustrated by FIG. 6, wherein current source 28 employs a transistor 60 and resistor 64 with the base of transistor 60 biased by voltage source VO through resistor 62 as a "constant" current course. Crystal resonator 66 having resonant frequency F2 is placed from the base of transistor 60 to ground and capacitors 68 and 70 are placed in a Colpitts oscillator configuration as shown. The base and emitter voltages of transistor 60, and subsequently the output current, are modulted at the oscillation frequency F2 of crystal resonator 66. The modulated current source 28 may also be employed in the circuits depicted by FIGS. 4 and 5.

Figure 7:
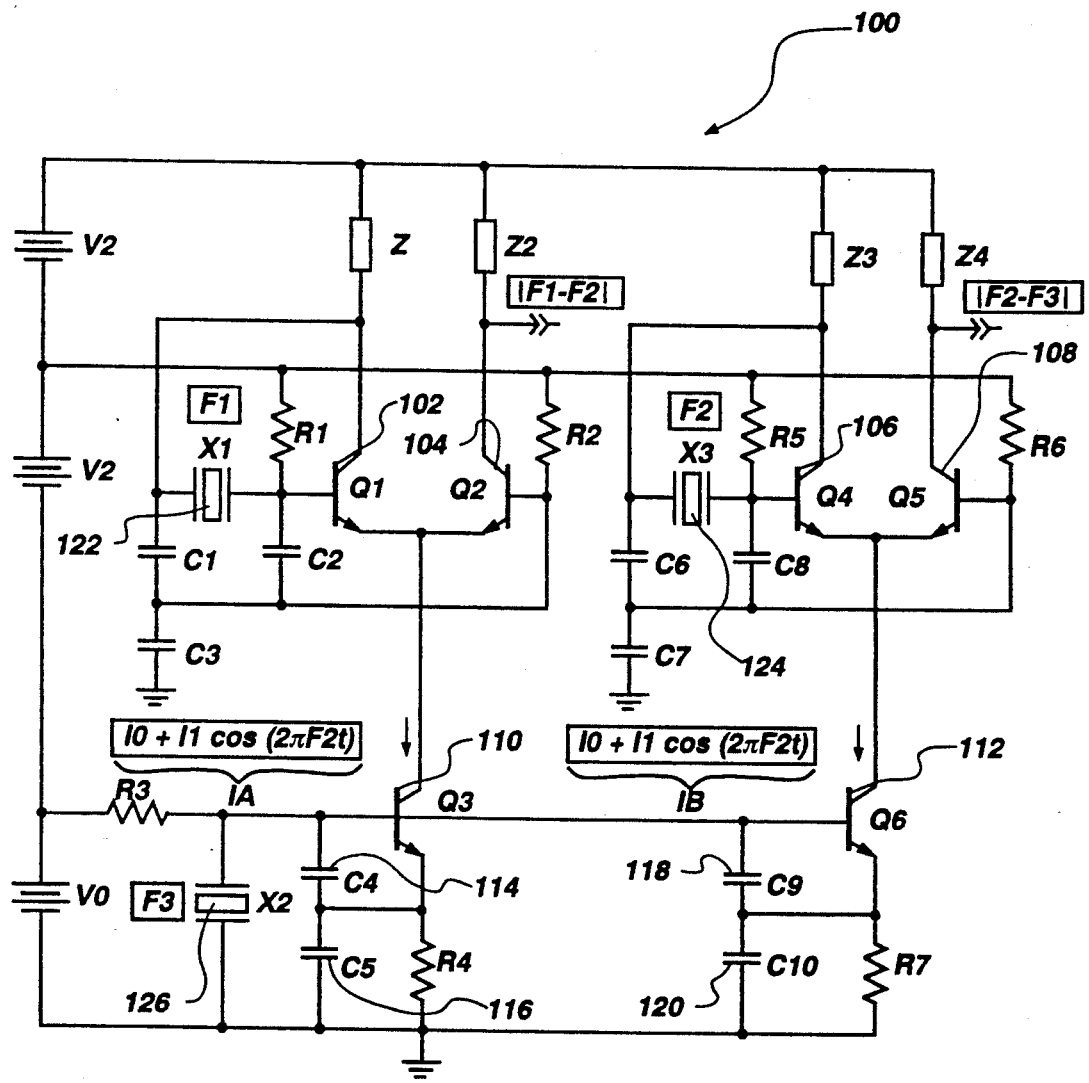
FIG. 7 is a circuit schematic of a dual DMO with distributed Colpitts oscillator current sources.

A first preferred embodiment 100 of a multiple DMO circuit with distributed current sources is illustrated by FIG. 7. In simple terms, embodiment 100 incorporates two DMO's of the FIG. 3 configuration, and current source 28 of the configuration of FIG. 6. In embodiment 100, a first DMO is built around transistors 102 and 104, and a second DMO around transistors 106 and 108. Two similar current sources IA and IB (which may be, but are not necessarily, the same), one for each DMO, are created by transistors 110 and 112 which, in combination with reactive elements 114, 116, 118 and 120 form a Colpitts oscillator with distributed gain and reactive elements. The modulated collector currents of transistor 110 and 112 are fed to their respective DMO's, thereby providing mixed frequency outputs |F1-F2| and |F2-F3|, respectively. A circuit configuration in accordance with FIG. 7 has been used successfully in a crystal resonator pressure transducer, wherein crystal resonator 122 is a crystal exposed to pressure changes, crystal resonator 124 is a temperature-sensitive crystal employed to compensate for temperature-induced frequency changes in crystal resonator 122, and crystal resonator 126 is a reference crystal providing a constant frequency reference signal.

Figure 8:
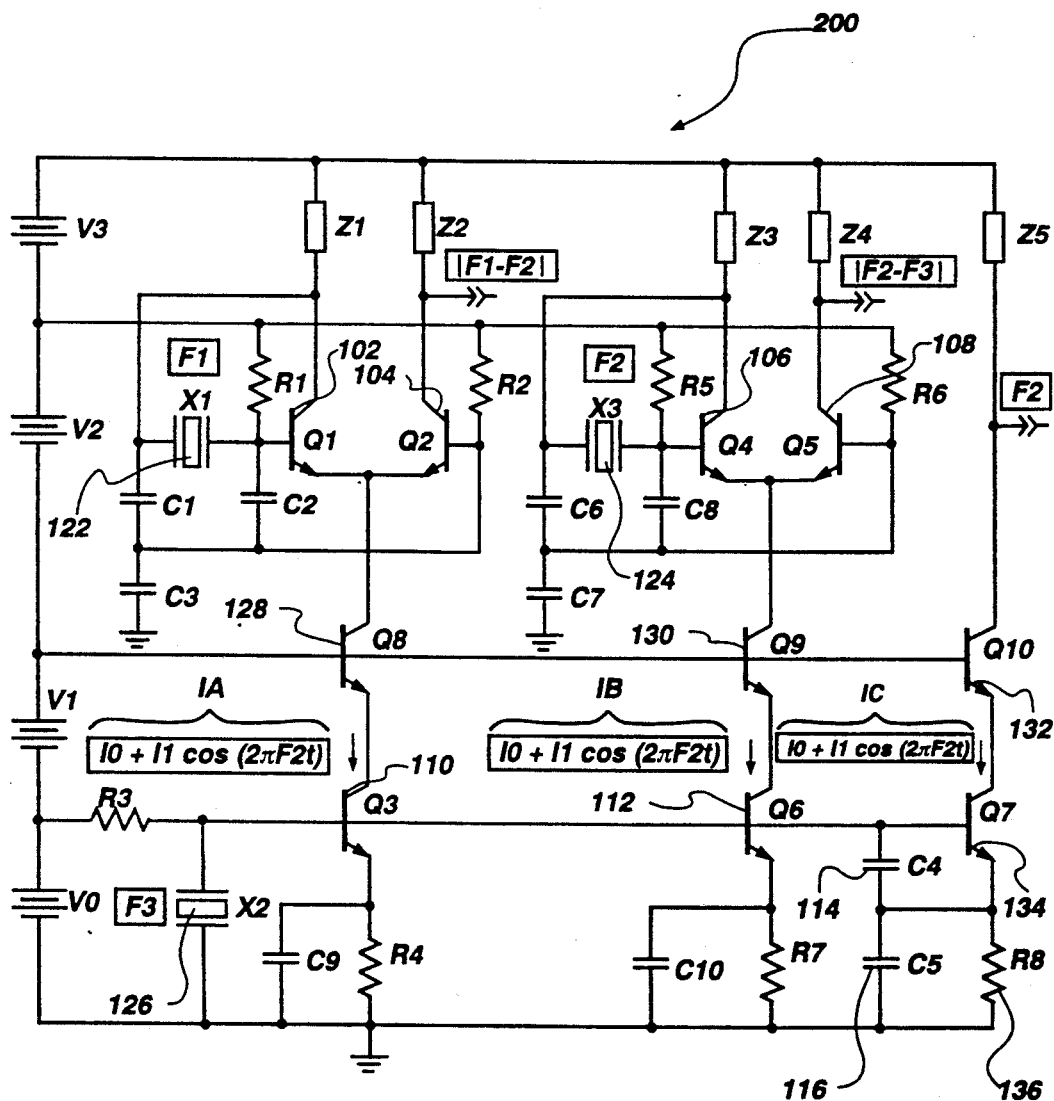
FIG. 8 is a circuit schematic of a dual isolated DMO with separate reference frequency output.

Another preferred embodiment 200 of a multiple DMO circuit is illustrated by FIG. 8, which is similar to FIG. 7 and employs the same reference numerals for similar components. The only notable difference in FIG. 8 vis-a-vis FIG. 7 is the addition of transistors 128, 130 and 132. Transistors 128 and 130 effect isolation of the two DMO's, and are placed in series with the bias current for the DMO's in a common base CASCODE configuration. The common emitter current source transistors 110 and 112 have base voltages modulated at frequency F2 generated by a Colpitts oscillator consisting essentially of crystal 126, tank capacitors 114 and 116, transistor 134 and resistor 136, the Colpitts oscillator providing an output to the bases of transistors 110 and 112. The unmixed reference output F2 of crystal 126 is available at the collector of transistor 132. In the preferred embodiment 200 of FIG. 8, the outputs of the current sources IA, IB, and IC need not be similar, thus providing an advantage over embodiment 100 at the expense of minimal additional components. A successful pressure transducer has been built in accordance with the circuit of FIG. 8.

It will be appreciated by those skilled in the art that additional configurations of differential oscillators having frequency modulated current sources may be created, such other and further configurations being logical extensions of the present invention as disclosed herein in terms of certain preferred embodiments, and falling within the scope of the invention as hereinafter claimed.

What is claimed is:

1. An apparatus for sustaining the vibration of a first crystal resonator and for providing a mixed frequency output, comprising:

first and second transistors arranged in a differential pair configuration as a sustaining amplifier for said first crystal resonator;

a current source for providing a current having a first component and a second current component, said first current component being constant and of sufficient magnitude to sustain said vibration of said first crystal resonator substantially at a resonant frequency F1, and said second component being modulated at a second frequency F2; and impedance means for selectively filtering said mixed frequency output.

2. The apparatus of claim 1, further comprising means for providing biasing and phase shift for said differential pair of transistors.

3. The apparatus of claim 1, further comprising means for providing base bias for each of said transistors.

4. The apparatus of claim 1, wherein said current source comprises an oscillator circuit including a second crystal resonator and a third transistor.

5. The apparatus of claim 4, wherein said oscillator circuit comprises a Colpitts oscillator circuit.

6. The apparatus of claim 4, wherein the output current from said current source is taken from the collector of said third transistor.

7. The apparatus of claim 1, wherein said impedance means is selected from the group comprising a tuned LC circuit and an RC low pass filter.

8. The apparatus of claim 1, wherein said mixed frequency output is the difference frequency |F1-F2|.

9. An apparatus for providing first and second mixed frequency outputs, comprising:

a first DMO circuit including a first crystal resonator and a differential pair of transistors as a sustaining amplifier therefor;

a second DMO circuit including a second crystal resonator and a differential pair of transistors as a sustaining amplifier therefor;

means for providing a current to each of said first and second DMO's, said currents each including a constant current component for driving a said crystal resonator at a resonant frequency and a modulated current component of a different frequency than the resonant frequencies of either said first or said second crystal resonators; and means for selectively filtering the mixed frequency outputs of said first and second DMO's.

10. The apparatus of claim 9, wherein said means for providing a current comprises an oscillator circuit including a third crystal resonator and two transistors, current being provided to each of said DMO's via one of said two transistors.

11. The apparatus of claim 10, wherein said oscillator circuit comprises a Colpitts oscillator circuit.

12. The apparatus of claim 10, wherein said current is provided to said DMO's via the collectors of said transistor.

13. The apparatus of claim 9, further including means for further isolating said first and second DMO's, said isolating means comprising transistor means placed in series with the current from said means for providing a current in a common base CASCODE configuration.

14. The apparatus of claim 9, further including means for providing a reference frequency output from said means for providing a current.

* * * * *